United States Patent [19]

Taskar et al.

[11] Patent Number: 5,354,708
[45] Date of Patent: Oct. 11, 1994

[54] METHOD OF NITROGEN DOPING OF II-VI SEMICONDUCTOR COMPOUNDS DURING EPITAXIAL GROWTH USING AN AMINE

[76] Inventors: Nikhil R. Taskar, 38 ½ Walden Rd.; Babar A. Khan, 15 Bracken Rd., both of Ossining, N.Y. 10562; Donald R. Dorman, Kentview Dr., Carmel, N.Y. 10512

[21] Appl. No.: 91,634

[22] Filed: Jul. 14, 1993

Related U.S. Application Data

[63] Continuation-in-part of Ser. No. 894,308, Jun. 4, 1992, Pat. No. 5,273,931.

[51] Int. Cl.$^5$ .............................................. H01L 21/20
[52] U.S. Cl. .................................. 437/108; 437/247; 437/106; 148/DIG. 41; 148/DIG. 64
[58] Field of Search ................... 437/108, 106, 247; 148/DIG. 40, DIG. 41, DIG. 64

[56] References Cited

U.S. PATENT DOCUMENTS

| 5,068,204 | 11/1991 | Kukimoto et al. | 148/DIG. 41 |
| 5,213,998 | 5/1993 | Oiu et al. | 148/DIG. 64 |
| 5,227,328 | 7/1993 | Khan et al. | 148/DIG. 64 |

OTHER PUBLICATIONS

Park et al., "P-type ZnSe by Nitrogen Atom Beam Doping During Molecular Beam Epitaxial Growth", Appl. Phys. Lett. 57(20) No. 12, Nov. 1990, pp. 2127–2129.
S. Zhang and N. Kobayashi, Jpn. J. Appl. Phys., 31, L666 (Jun. 1992).
S. G. Fujita et al. Jpn. J. Appl. Phys., 26, L2000 (1987).
S. Z. Gujita et al. J. Cryst. Grow., 101, 48 (1990).

Primary Examiner—Tom Thomas
Assistant Examiner—Tuan Nguyen

[57] ABSTRACT

The concentration of N acceptors in an as-grown epitaxial layer of a II-VI semiconductor compound is enhanced by the use of tertiary butyl amine as the dopant carrier, and is further enhanced by the use of photo-assisted growth using illumination whose wavelength is at least above the bandgap energy of the compound at the growth temperature.

12 Claims, 4 Drawing Sheets

METHOD OF NITROGEN DOPING OF II-VI SEMICONDUCTOR COMPOUNDS DURING EPITAXIAL GROWTH USING AN AMINE

CROSS REFERENCE TO RELATED APPLICATIONS

This application is a continuation-in-part of U.S. Patent application Ser. No. 894,308, filed Jun. 4, 1992, now U.S. Pat. 5,273,931. (Attorney Docket No. PHA 21,734), and assigned to the present Assignee. The specification of application Ser. No. 894,308 is incorporated herein by reference.

BACKGROUND OF THE INVENTION

This invention relates to the growth of epitaxial layers of II-VI semiconductor compounds, such as ZnSe, and more particularly relates to a method of incorporating N acceptors into the II-VI lattice of such compounds.

Co-pending parent application Ser. No. 894,308, describes a method of N-doping epitaxial layers of II-VI semiconductor compounds during growth by flow modulation epitaxy (FME) using $NH_3$ as the dopant carrier.

One problem encountered when using $NH_3$ as the carrier, is the tendency toward passivation of N acceptors due to the presence of H. This is due to the inability of $NH_3$ to completely dissociate into N at the growth surface. This problem persists even if photolysis of the carrier is performed above the growth surface, probably due to the short free mean path between the dissociated species, giving rise to recombination of these species.

Another problem that arises when using $NH_3$ as the carrier is that it tends to react with the carriers of the cation and anion species, due to its highly basic chemical nature. This results in degradation of the II-VI compound crystal lattice, such degradation increasing with increasing flow rate of the dopant carrier gas.

Tertiary Butyl Amine ($TBNH_2$) has been used as the N dopant source in the epitaxial growth of ZnSe by molecular beam epitaxy (MBE). However, the $TBNH_2$ was dissociated into $(CH_3)C-$ and $-NH_2$ by thermal cracking at temperatures in the range of about 550 to 850 degrees C. prior to being introduced into the growth chamber. S. Zhang and N. Kobayashi, Jpn. J. Appl. Phys., 31, L666 (June 1992). Thus, the above-described problems of passivation and reactivity encountered when using $NH_3$ would be expected to be encountered in this technique as well.

When epi layers of ZnSe are grown by the technique of MOVPE (metal organic vapor phase epitaxy), photo-assisted growth using above bandgap illumination (illumination whose energy is above the bandgap energy of the semiconductor compound at the growth temperature) has been found to enhance the growth rate of the layer, permitting lower growth temperatures, at which the sticking coefficient of the N species is increased. Sg. Fujita et al, Jpn. J. Appl. Phys., 26, L2000 (1987). In addition, the use of below-bandgap illumination has been observed to enhance doping efficiency on the Se sublattice. Sz. Fujita et al, J. Cryst. Grow., 101, 48 (1990).

OBJECTS AND SUMMARY OF THE INVENTION

It is an object of the invention to provide a method for N-doping epitaxial layers of II-VI semiconductor compounds (such as ZnSe and its alloys) which overcomes the above disadvantages encountered when using $NH_3$ or dissociated $TBNH_2$ as the carrier species.

In accordance with the invention, it has been discovered that when an amine is employed as the carrier for doping N into II-VI semiconductor compound lattices during epitaxial growth, and is introduced into the epitaxial growth chamber in an undissociated state, the N acceptor concentration is increased.

This result is believed to be due to the fact that the $C-NH_2$ bond strength in amines is weaker than the $H-NH_2$ bond strength in amines and ammonia. As a result, a larger concentration of $NH_2$ at the growth surface is expected to be available for further dissociation into N and NH. In addition, the carbon group radical is available to extract an H from the $-NH_2$ radical as the $C-NH_2$ bond dissociates. The remaining H could be extracted by a $CH_3$ attached to a Zn on a neighboring lattice site.

Another advantage of amines is their larger molecular size relative to $NH_3$, which is expected to result in less reactivity with the other growth species carriers, such as MO Zn and MO Se, resulting in less degradation of the crystal lattice and less compensating defects (donor-like complexes involving N and native point defects).

As used herein, the term "amine" means $R-NH_2$, where R is a hydrocarbon group radical and includes the homologous series $(C_xH_{2x+1})-C_y-NH_2$, where x is from $2y+1$ to 18, and y is from 0 to 1. Typical examples are the primary alkyl amines, such as ethyl amine, methyl amine, iso propyl amine, tertiary butyl amine and pentyl amine.

The temperature at which growth is carried out must not exceed about 500 degrees C., above which thermal cracking of the amine before it reaches the growth surface becomes likely, and the sticking co-efficient of N on the growth surface becomes negligible. Accordingly, the growth temperature preferably should not exceed about 400 degrees C.

In accordance with a preferred embodiment of the invention, growth is carried out by the technique of vapor deposition, referred to variously in the art as CVD (chemical vapor deposition), VPE (vapor phase epitaxy) and FME (flow modulation epitaxy). Where the growth species are carried as metal organic (MO) compounds such as dimethyl Zn or Se (Dm Zn or Dm Se), then CVD and VPE are referred to as MOCVD and MOVPE, respectively.

Vapor deposition is typically carried out at a pressure of from about 1 to 716 Torr, as compared to about $10^{-10}$ to $10^{-11}$ Torr as the background pressure for molecular beam epitaxy, and generally results in higher growth rates, and can result in more even distribution of the growth species along the growth surface, due to the ability to control the flow pattern of the carrier gas.

In accordance with another preferred embodiment, the growth is photo-assisted by above-band gap or a combination of above- and below-bandgap illumination. Unexpectedly, such photo-assisted growth using above-bandgap illumination (meaning illumination whose energy is above the bandgap energy of the II-VI compound at the growth temperature) results in enhanced N acceptor concentration in the epi layer.

BRIEF DESCRIPTION OF THE DRAWING

The invention will now be described in terms of the growth and evaluation of a series of epitaxial layers, with reference to the figures, in which.

DESCRIPTION OF THE PREFERRED EMBODIMENTS

PL measurements were carried out while maintaining the sample at a temperature of about 7 K to 8 K. Excitation was achieved by aiming the beam of an argon-ion laser at the sample surface, using the UV line at 3500 A° with an intensity of 0.2 mw and a spot size of about 100 microns diameter, resulting in an energy density of about 2 w/cm$^2$.

Figure 1:
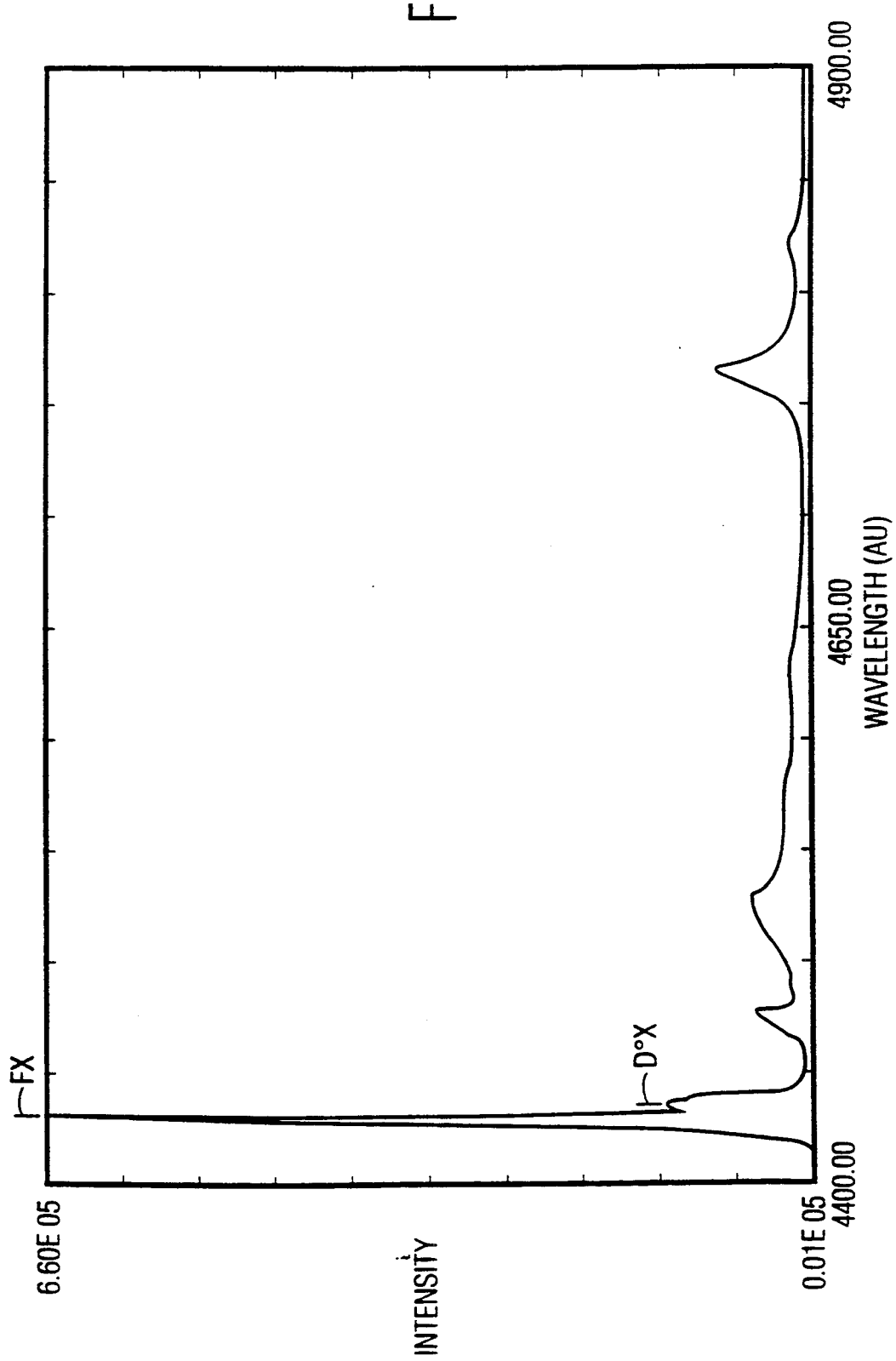
FIG. 1 is a photo-luminescence (PL) spectrum of an undoped epitaxial layer of ZnSe grown by MOVPE at 350 degrees C. and photo-assisted using a xenon lamp, in which intensity in arbitrary units is plotted versus wavelength in Angstroms of the PL excitation source.

FIG. 1 shows the PL spectrum of an undoped epi layer of ZnSe grown at 350° C., photo-assisted by a mercury lamp with optical filters resulting in illumination wavelengths in the range between about 3300 and 5800 A°, corresponding to an energy range of about 3.75 to 2.14 eV, encompassing energies above and below the bandgap energy of about 2.45 eV (~5000 A°). At the growth temperature, DMZn (dimethyl Zn) and DMSe (dimethyl Se) vapor flows were set at 0.32 sccm and 1.6 sccm, respectively. Since this layer is undoped, only the Free (FX) and Donor bound ($D^OX$) excitonic emission is observed in the PL spectrum. The Acceptor bound ($A^OX$) excitonic emission is not observed and neither is the Donor-Acceptor (D-A) pair spectrum.

Figure 2:
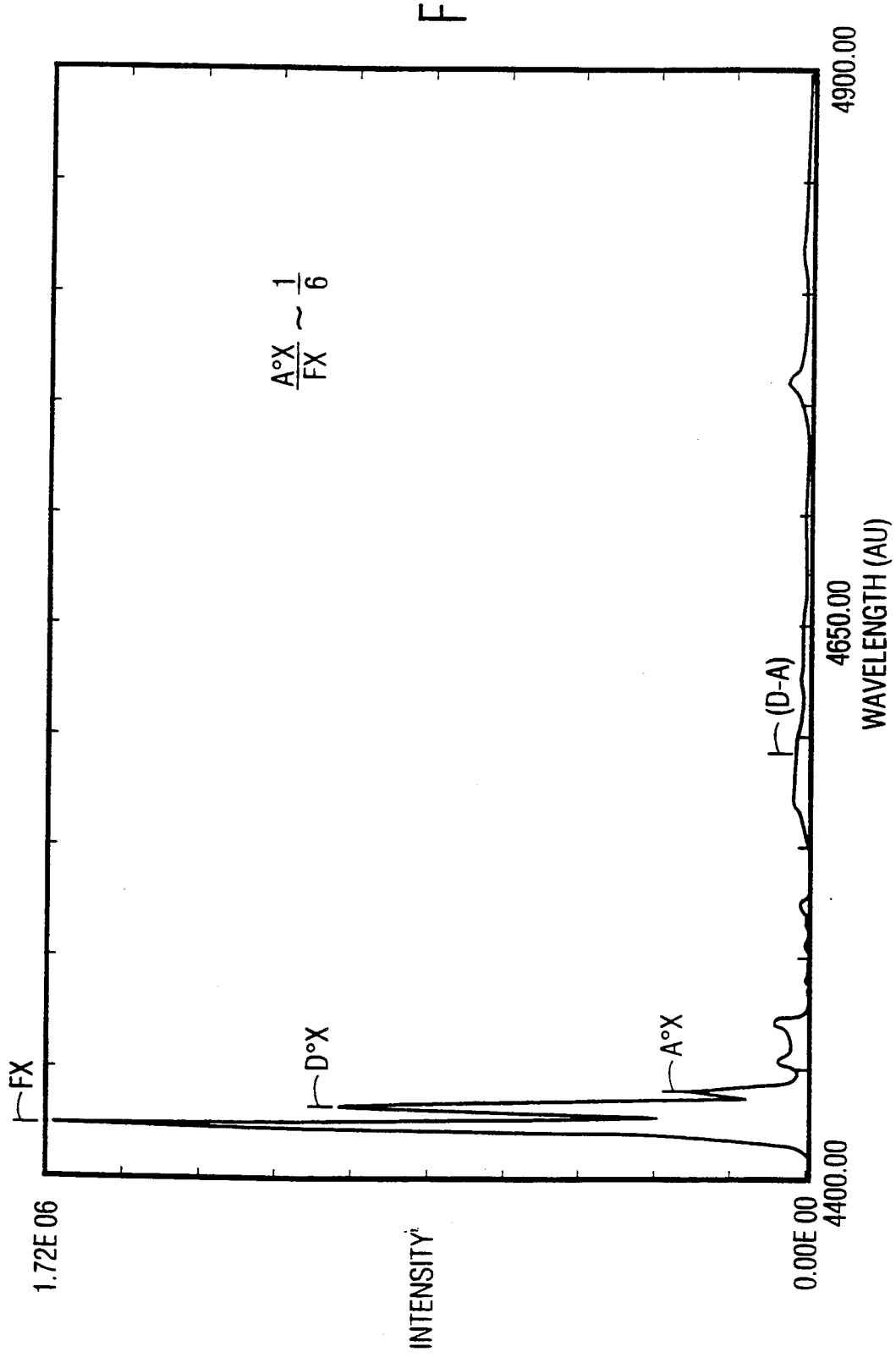
FIG. 2 is a PL spectrum similar to that of FIG. 1 for a ZnSe epi layer doped with N and using $TBNH_2$ as the dopant carrier gas at a flow rate of about 10 sccm.

FIG. 2 shows the PL spectrum of an epi layer of ZnSe doped with N using a flow of 10 sccm of $TBNH_2$ (tertiary butyl amine). All other growth parameters were similar to those used to obtain the PL spectrum of FIG. 1. In addition to the FX and $D^OX$ peaks, the $A^OX$ peak and the D-A pair spectrum are also seen. These $A^OX$ and D-A peaks indicate the incorporation of N acceptors into the II-VI lattice.

Figure 3:
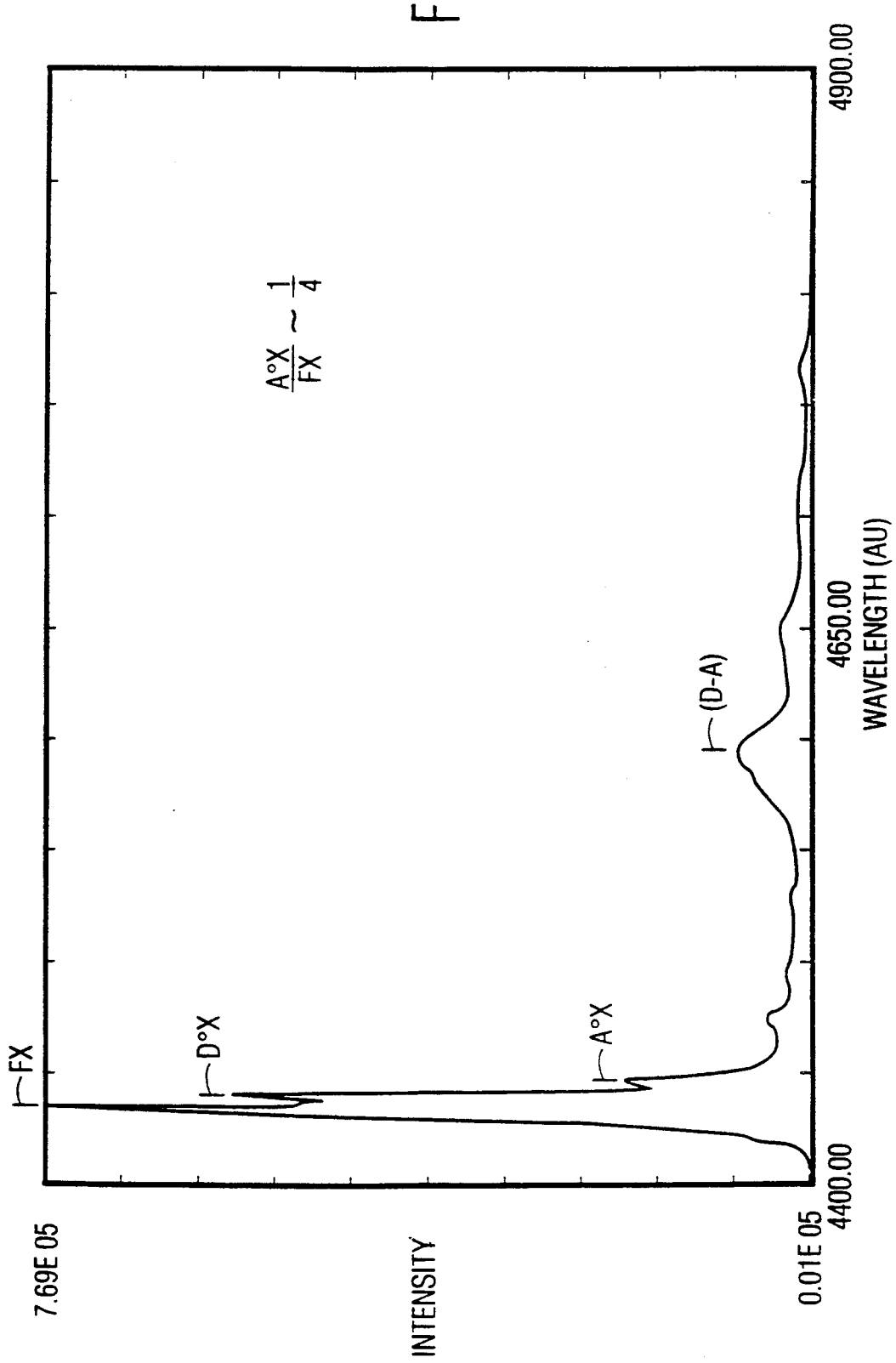
FIG. 3 is a PL spectrum similar to that of FIG. 2, in which growth is photo-assisted with a gas laser.

FIG. 3 shows the PL spectrum of an epi layer of ZnSe grown under similar conditions to those for the layer of FIG. 2, except that a 193 nm excimer laser beam having an above bandgap energy of about 6.42 eV (~1930 A°) was positioned parallel to the sample surface. The $A^OX$ peak is slightly enhanced relative to the FX peak, as compared to FIG. 2. This indicates an increase in the N acceptors due to the presence of the excimer laser beam.

Figure 4:
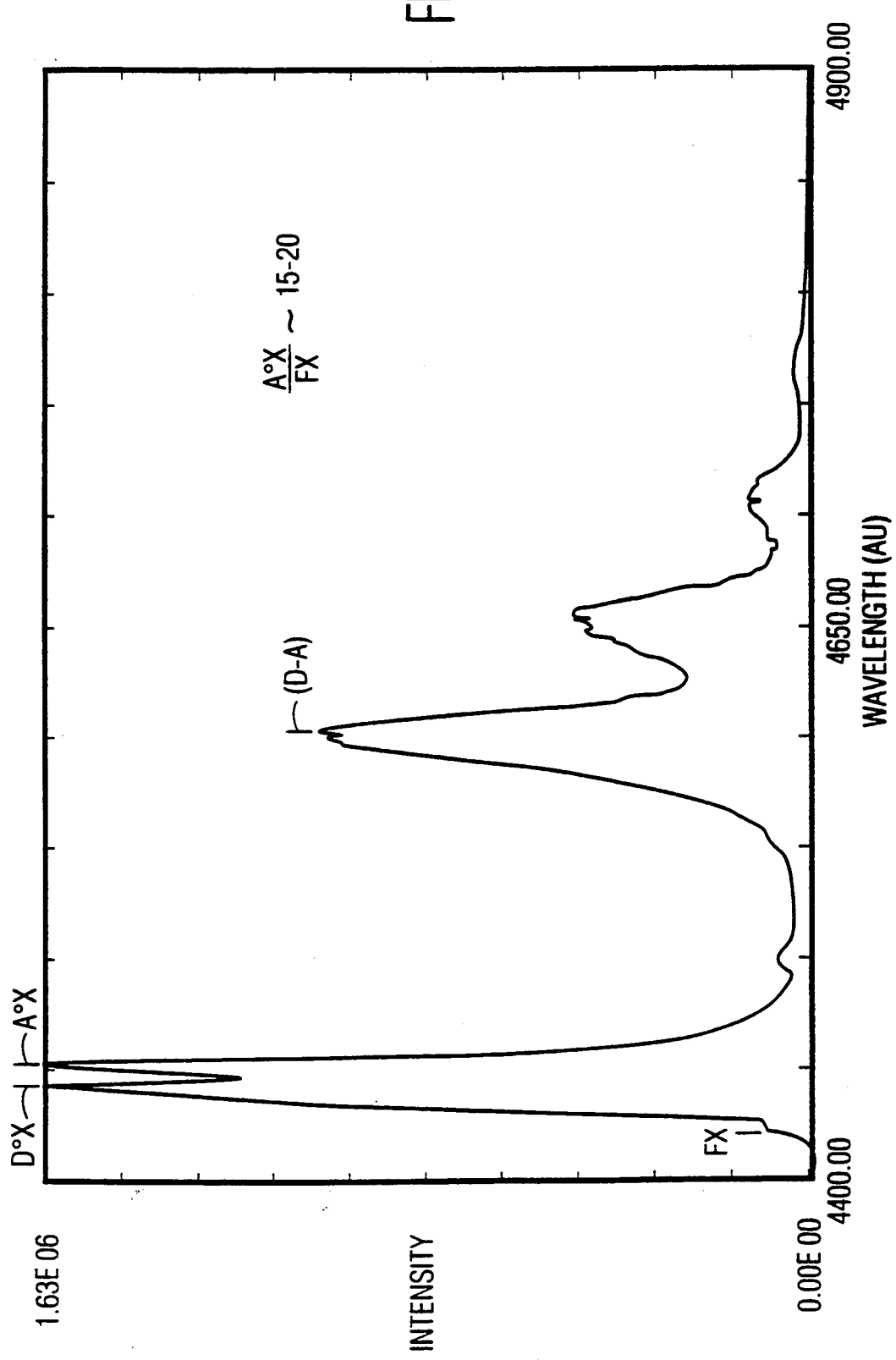
FIG. 4 is a PL spectrum similar to that of FIG. 3, in which the flow rate of $TBNH_2$ is about 25 sccm

FIG. 4 shows the PL spectrum of an epi layer of ZnSe grown under conditions similar to those for FIG. 3, except that the flow of $TBNH_2$ was increased to 25 sccm. The $A^OX$ peak is further enhanced relative to the FX peak, as compared to FIG. 3. The D-A pair spectrum intensity is also enhanced compared to FIG. 3. This indicates that the increased flow of the dopant results in a higher N acceptor concentration. As will be appreciated, even higher flow rates should result in p-type ZnSe. As is known, such p-type ZnSe can be used in the fabrication of blue and blue green LEDs and lasers.

In FIG. 4, the ratio $A^OX/FX$ is ~20, which is two to four times larger than the ratio obtained using a similar flow of $NH_3$ ($A^OX/FX$ ~5-10). This indicates a higher doping efficiency of N acceptors into the as-grown layer for $TBNH_2$ as compared to $NH_3$.

We have demonstrated the incorporation of N acceptors in to ZnSe epi layers using an amine as the N carrier and using illumination with above- and below-bandgap wavelengths, and N acceptor concentration (measured optically by PL) in the as-grown ZnSe epi layer with $TBNH_2$ as the dopant carrier higher than in the case of $NH_3$, for identical flow rates, indicating a higher N acceptor incorporation efficiency.

Increasing the growth temperature to 370 C. from 350 C. was found to decrease the incorporation of nitrogen acceptors, indicating the advantage of lower growth temperatures enabled by photo-assisted growth.

As will be appreciated by those skilled in the art, the concentration of donor-forming impurities such as chlorine in the carrier gas should be kept as low as possible, in order to minimize incorporation into the II-VI lattice where compensation of the N acceptors would occur.

As is known, a variety of Zn and Se growth precursors could be used, in any combination, for example, Diethyl Zinc, Diethyl Selenium, Dimethyl Zinc, Dimethyl Selenium and Hydrogen Selenide.

Bandgap energy of the II-VI compound would typical range from about 3.7 eV (~3300 A°) to 2.0 eV (~6200 A°), for example, 2.45 eV (~5000°A) for ZnSe at a growth temperature of about 350° C. Suitable illumination sources for above- and below-bandgap photo-assisted growth include high pressure lamps, e.g., Hg and xenon lamps (energy range about 5 eV (~2500 A°) to 1.55 eV (~8000 A°)), while above bandgap illumination could be provided, for example, by lasers, such as exited dimer (excimer) gas lasers (energy range about 6.42 eV to 3.53 eV).

If the II-VI epi layer is grown directly on a GaAs substrate, then a buffer layer (e.g., ~100 A in thickness) of the II-VI compounds can be grown first to facilitate the growth of the doped layer. This buffer layer could be grown using a variety of techniques.

The invention has been described in terms of a limited number of embodiments. Other embodiments and variations of embodiments will become apparent to those skilled in the art, and are intended to be encompassed with in the scope of the appended claims.

What is claimed is:

1. A method of incorporating N acceptors into an epitaxial layer of a II-VI semiconductor compound, the method comprising introducing an amine in an undissociated state into the growth chamber during growth of the epitaxial layer.

2. The method of claim 1 in which the amine is tertiary butyl amine.

3. The method of claim 1 in which the temperature in the growth chamber does not exceed about 500 degrees C.

4. The method of claim 3 in which the temperature in the growth chamber does not exceed about 400 degrees C.

5. The method of claim 1 in which the growth is photo-assisted.

6. The method of claim 5 in which growth is photo-assisted with illumination whose energy is above the bandgap energy of the semiconductor compound at the growth temperature.

7. The method of claim 6 in which growth is photoassisted with illumination whose energy is below the bandgapenergy of the semiconductor compound in addition to the above-bandgap illumination.

8. The method of claim 6 in which the source of the illumination is an excited dimer laser.

9. The method of claim 8 in which the illumination beam is directed approximately parallel to the surface of the epitaxial layer.

10. The method of claim 1 in which the semiconductor compound is ZnSe.

11. The method of claim 4 in which the growth temperature is about 350 degrees C.

12. The method of claim 1 in which the epitaxial growth is carried out by the technique of vapor deposition.

* * * * *